(12) United States Patent
Griffiths et al.

(10) Patent No.: US 6,576,064 B2
(45) Date of Patent: *Jun. 10, 2003

(54) SUPPORT APPARATUS FOR SEMICONDUCTOR WAFER PROCESSING

(75) Inventors: Stewart K. Griffiths, Danville, CA (US); Robert H. Nilson, Cardiff, CA (US); Kenneth J. Torres, Austin, TX (US)

(73) Assignee: Sandia Corporation, Livermore, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/891,304

(22) Filed: Jul. 10, 1997

(65) Prior Publication Data

US 2001/0001953 A1 May 31, 2001

(51) Int. Cl.[7] ............................ C23C 16/00; B05C 13/00
(52) U.S. Cl. .................. 118/728; 118/500; 156/345.51; 432/249
(58) Field of Search ................................ 118/728, 715, 118/729, 725, 500, 502; 432/249, 241

(56) References Cited

U.S. PATENT DOCUMENTS

| | | | | |
|---|---|---|---|---|
| 5,160,152 A | * | 11/1992 | Toraguchi et al. | 279/128 |
| 5,192,087 A | | 3/1993 | Kawashima et al. | 279/71 |
| 5,456,756 A | * | 10/1995 | Ramaswami et al. | 118/721 |
| 5,482,558 A | * | 1/1996 | Watanabe et al. | 118/725 |
| 5,492,229 A | | 2/1996 | Tanaka et al. | 211/41 |
| 5,494,524 A | | 2/1996 | Inaba et al. | 118/728 |
| 5,514,439 A | | 5/1996 | Sibley | 428/64.1 |
| 5,531,835 A | * | 7/1996 | Fodor et al. | 118/728 |
| 5,534,074 A | | 7/1996 | Koons | 118/728 |
| 5,605,574 A | | 2/1997 | Tsunashima et al. | 118/500 |
| 5,645,646 A | * | 7/1997 | Beinglass et al. | 118/728 |
| 5,656,093 A | * | 8/1997 | Burkhart et al. | 118/728 |
| 5,685,906 A | * | 11/1997 | Dietz et al. | 118/725 |
| 5,738,165 A | * | 4/1998 | Imai | 118/728 |
| 5,792,304 A | * | 8/1998 | Tamura et al. | 156/345 |
| 5,820,683 A | * | 10/1998 | Ishii et al. | 118/728 |
| 5,926,615 A | * | 7/1999 | Hwu et al. | 118/728 |
| 5,980,195 A | * | 11/1999 | Miyashita | 414/783 |
| 2001/0001953 A1 | * | 5/2001 | Griffiths et al. | 118/728 |

FOREIGN PATENT DOCUMENTS

| | | | | |
|---|---|---|---|---|
| JP | Hei4 (1992)-133417 | 5/1992 | | H01L/21/205 |
| JP | Hei 5-166741 | 7/1993 | | H01L/21/22 |
| JP | 8-181054 | * | 7/1996 | |
| WO | WO99/26280 | * | 5/1999 | |

OTHER PUBLICATIONS

Merriam–Webster's Collegiate Dictionary, 10th Ed. "support", p. 1184.*

* cited by examiner

Primary Examiner—Jeffrie R. Lund
(74) Attorney, Agent, or Firm—Timothy P. Evans

(57) ABSTRACT

A support apparatus for minimizing gravitational stress in semiconductor wafers, and particularly silicon wafers, during thermal processing. The support apparatus comprises two concentric circular support structures disposed on a common support fixture. The two concentric circular support structures, located generally at between 10 and 70% and 70 and 100% and preferably at 35 and 82.3% of the semiconductor wafer radius, can be either solid rings or a plurality of spaced support points spaced apart from each other in a substantially uniform manner. Further, the support structures can have segments removed to facilitate wafer loading and unloading. In order to withstand the elevated temperatures encountered during semiconductor wafer processing, the support apparatus, including the concentric circular support structures and support fixture can be fabricated from refractory materials, such as silicon carbide, quartz and graphite. The claimed wafer support apparatus can be readily adapted for use in either batch or single-wafer processors.

7 Claims, 5 Drawing Sheets

SUPPORT APPARATUS FOR SEMICONDUCTOR WAFER PROCESSING

STATEMENT OF GOVERNMENT INTEREST

This invention was made with Government support under contract No. DE-AC04-94AL85000 awarded by the U.S. Department of Energy to Sandia Corporation. The Government has certain rights in the invention.

CROSS-REFERENCE TO RELATED APPLICATIONS

Not Applicable

BACKGROUND OF THE INVENTION

The present invention pertains generally to apparatus for supporting semiconductor wafers during thermal processing and particularly to apparatus for supporting silicon wafers during high temperature processing such that gravitational stresses are mitigated.

Modern microelectronic devices or integrated circuits (ICs) are fabricated using processes in which hundreds of individual ICs or dies are produced simultaneously on a single silicon wafer. The production of ICs generally requires several dozen thermal and deposition processes, all of which are performed on these monolithic single-crystal wafers. These processes are performed either in single-wafer tools or in large batch furnaces containing up to a few hundred wafers. After processing, the wafers are cut apart to produce individual IC dies.

The historical trends of reduced IC costs and increased productivity in microelectronics manufacturing have been obtained in part by employing progressively larger silicon wafers. Increasing the silicon wafer size allows more IC dies to be produced from each silicon wafer. This reduces unit IC costs by reducing handling costs and by increasing the areal throughputs of both batch and single-wafer tools. The trend of increasing silicon wafer size is also driven in part by the continuously increasing size of IC dies. As die sizes increase, the silicon wafer size must also increase to permit the same number of dies on each wafer. Current production wafers range in diameter up to 200 mm, but the introduction of 300 mm wafers is now under way.

As silicon wafers are heated and cooled during thermal and deposition processes, temperature variations arise across the wafer face. These temperature variations give rise to thermal stress in the wafer. If the thermal stress exceeds the yield strength of the wafer, slip lines or other microstructural defects will be produced in the wafer crystal. Such defects lead to failure of IC devices and so must be strictly avoided. Consequently, the importance of controlling thermal stress has been widely recognized. The heating and cooling rates and the push and pull rates at which silicon wafers are inserted into or withdrawn from batch furnaces have both been reduced for larger wafer sizes in order to reduce temperature variations across the wafers. On the other hand, it is desirable to increase heating and cooling rates in order to increase wafer throughput. Recently, new batch furnace designs have been developed in which the wafer spacing is increased to reduce temperature variations and so permit more rapid heating and cooling.

Thermal stress is just one of several size-dependent sources of stress in silicon wafers. As wafer sizes increase, gravitational stress also increases. Like thermal stress, gravitational stress will lead to crystal defects if their values exceed the yield strength of the wafer. These stresses arise from supporting the weight of the wafer on a limited number of points and originate both from the local effects of the support and, more importantly, from bending of the wafer due to its weight in unsupported regions. In the past, wafer diameters were small enough and wafer thicknesses were sufficiently large such that gravitational stresses were quite small. As such, gravitational stresses have not been a serious concern, and a wide variety of support methods have been used successfully for wafer sizes up to 200 mm.

Silicon wafer thicknesses have historically increased at rates much lower than those of wafer diameters. Nominal wafer thicknesses are 625, 725 and 775 $\mu$m at wafer diameters of 150, 200 and 300 mm. Since gravitational stresses generally scale as the square of the wafer diameter and inversely as the wafer thickness, gravitational stresses will increase even if the wafer thickness grew in proportion to the wafer size. As a result, gravitational stresses have increased dramatically with increasing wafer size for any fixed support geometry. The increasing importance of gravitational stresses and the necessity for reducing or eliminating gravitational stresses by providing proper support for wafers during thermal processing has been recognized as described in U.S. Pat. Nos. 5,492,229 and 5,605,574, by way of example.

FIG. 1 illustrates the influence of wafer size on gravitational stress for the wafer thickness variation shown by the dotted line in FIG. 2. Here the computed maximum shear stress appearing anywhere on the wafer is shown for several common support geometries (B, C, and D). The common geometries are: (B) a single ring located at about 70% of the wafer radius; (C) a single ring located at the wafer edge; and (D) a three-point support having support locations at the wafer edge and at angular positions of 0, 90, and 180 degrees. The last of these is a very common support geometry for batch furnaces because it permits insertion and withdrawal of the wafers from the front of the multi-wafer support structure referred to as a boat.

FIG. 1 shows that gravitational stress increases rapidly with increasing wafer size. Between 200 and 300 mm wafer diameters, the maximum gravitational stress roughly doubles for all support geometries. Further, the method of support plays an important role in determining these stresses. The maximum shear stress on a wafer for three point support is about a factor of ten above that for an edge ring and nearly a factor of forty above that for a ring placed well in from the wafer edge (70% of the wafer diameter).

Gravitational stresses do not vary with temperature they depend only on the wafer diameter, wafer thickness and the support geometry. In contrast, the strength of silicon falls rapidly as the temperature is increased. As a result, the fixed gravitational stress becomes a larger fraction of the decreasing yield strength as the silicon wafer temperature is increased. With increasing temperatures, the yield strength of the silicon wafer decreases to the point at which it becomes equal to the gravitational stress. At this point, the strength of the silicon has dropped to a level where the silicon wafer is failing under the stress of its own weight. It will then deform plastically, and defects will be produced in the crystal structure of the silicon wafer. This behavior has an important practical consequence in limiting both the maximum possible processing temperature as well as the allowable ramp rate (the rate at which the furnace and the silicon wafer temperatures increase or decrease).

Allowable ramp rates and maximum operating temperatures of batch furnaces are limited by the combined effects of thermal and gravitational stresses. As described hereinabove, thermal stress arises from the radial temperature gradients associated with heating and cooling of wafers. Faster ramp rates produce larger temperature differences and, hence, larger thermal stresses. Gravitational stress is associated with bending of the wafer under its own weight. With increasing wafer diameter, thermal stress remains invariant (for a given radial temperature difference) while gravitational stress increases as the square of the wafer diameter. Thus, as the wafer size increases the reduction of gravitational stress becomes of increasing importance in allowing higher maximum operating temperatures and increased furnace ramp rates.

FIG. 2 shows computed maximum allowable processing temperatures as a function of wafer size for the support geometries previously considered in FIG. 1. Note that support geometry has a strong influence on the maximum temperature. For a 200 mm wafer, the maximum temperature that can be sustained varies by almost 400° C. between the three-point and ring support geometries (B, C, and D). Further, for a 300 mm wafer the maximum processing temperature for the three point geometry is just above 900° C. This is well below the desired maximum of about 1200° C. needed to accommodate the full range of thermal and deposition processes. Similarly, the computed maximum for a 300 mm wafer supported by a full edge ring (FIG. 2, curve C) is only about 1150° C. Thus even this better support geometry will likely not be sufficient for all processes of practical interest. Although many of the maximum temperatures shown in FIG. 2 are above those of practical interest, these results include only gravitational stress. Other sources, such as thermal and film stresses, will also contribute to the total stress and thus will reduce the maximum allowable temperature.

Ring supports tend to minimize gravitational stress relative to point supports by reducing stresses near the support locations. For most placements of a single ring, the maximum stress occurs not at the support location, but instead near the center or edge of the wafer. It is known in the art that gravitational stress is minimized for a single ring support if the ring diameter is about 70% of the wafer diameter, regardless of the wafer size. This is one of the geometries considered in the results shown in FIGS. 1 and 2. For a 300 mm wafer, this support geometry gives a maximum allowable processing temperature of about 1300° C. Although this is above most temperatures of practical importance, combined thermal and gravitational stresses would likely yield an actual maximum temperature that is below the desired values for some processes. Moreover, the single ring support is undesirable for batch wafer processing applications because it obstructs front end loading of a batch furnace. Therefore, there is a need for further reduction of gravitational stress coupled with a geometry that will not obstruct efficient loading and unloading of a batch furnace or single wafer processor.

SUMMARY OF THE INVENTION

The present invention provides a novel support apparatus for semiconductor wafers, and particularly silicon wafers, that offers a significant reduction in the magnitude of gravitational stress for all wafer sizes during thermal processing. As silicon wafer diameters increase beyond 200 mm, reductions in gravitational stress will become increasingly important with respect to the continued use of high-temperature thermal and deposition processes in microelectronics manufacturing. Because reducing gravitational stress will permit higher heating and cooling rates in batch furnaces, this apparatus will also help reduce processing times and costs. Finally, the claimed wafer support apparatus can be readily adapted for use in either batch or single-wafer processors.

DETAILED DESCRIPTION OF THE INVENTION

Figure 3:
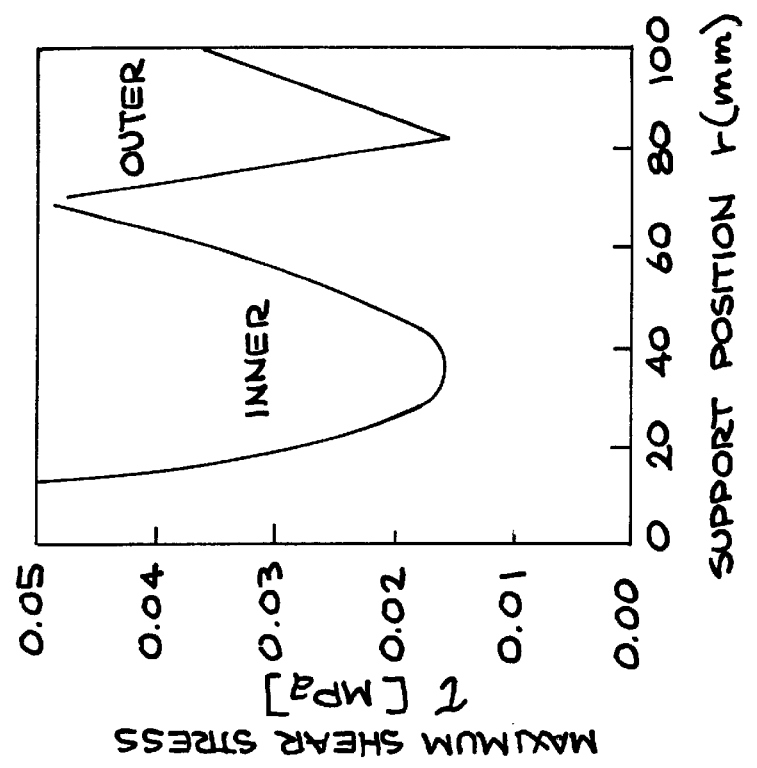
FIG. 3 shows maximum shear stress as a function of ring support position.

The inventors have determined that gravitational stress that arises in large diameter semiconductor wafers during thermal processing can be minimized by the use of two concentric support structures, particularly circular support structures and preferably rings, and have identified the optimum positions of the two concentric support structures. This optimum placement of the concentric support structures was determined by computing the maximum shear stress occurring anywhere in the wafer for all possible combinations of support positions and selecting those positions which gave the lowest maximum stress. A portion of this process is illustrated in FIG. 3 for 200 mm wafers. Here, one of two support structures, in the form of rings, is held at the optimum position while the position of the other is varied over some range. Such variation in the two ring positions yields two very strong minima in the maximum stress when the inner ring radius is at 35.0 mm and the outer ring radius is at 82.3 mm. Note that the irregular character of these two curves results from abrupt changes in the location of the maximum stress as the support locations of the rings are continuously varied.

The optimum placement of two concentric support structures produces several unique conditions. Namely, one-third of the wafer weight is carried on the inner structure and the remaining two-thirds is carried on the outer structure. Also, the maximum stress occurs simultaneously at two points on the wafer, corresponding to the two support positions. The stress at these two locations is the same when each support structure is placed at its optimum position.

Figure 1:
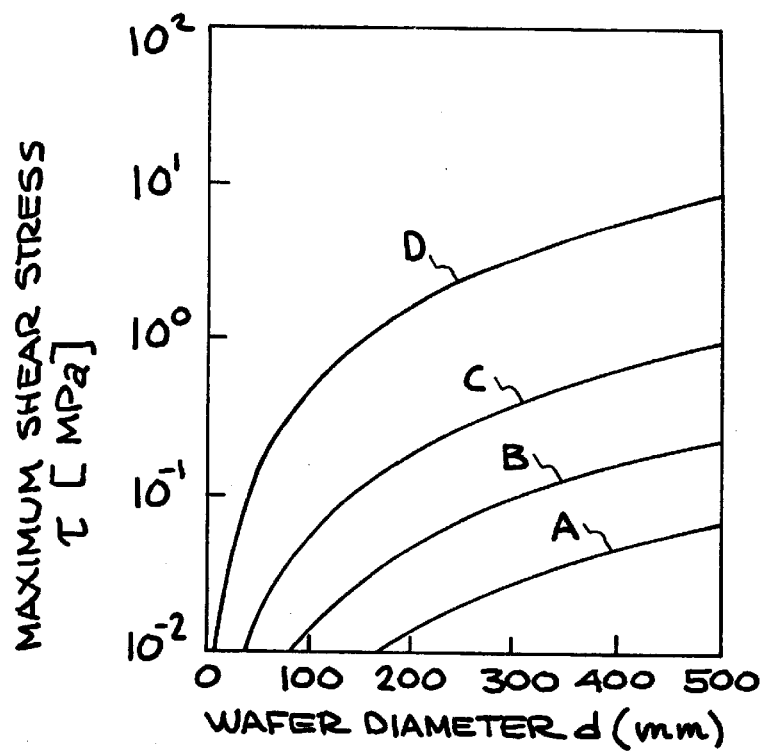
FIG. 1 shows gravitational stress as a function of wafer size for various wafer support structures.
Figure 2:
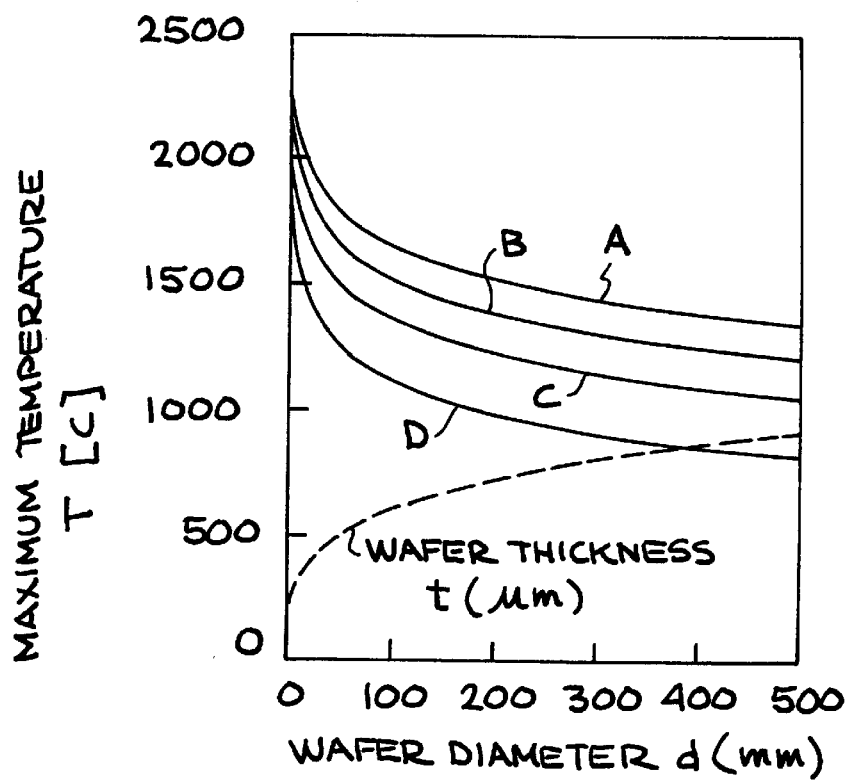
FIG. 2 shows the maximum allowable processing temperature as a function of size for various wafer support structures.

FIG. 1 (curve A) shows that optimum placement of two concentric ring support structures reduces the maximum gravitational stress by more than a factor of 100 below that for the three-point support and by more than a factor of 10 below that for a single ring support at the wafer edge. Compared with the single ring at the optimum position, the maximum stress for a two ring support structure at the optimum positions is reduced by an additional factor of three. Similarly, FIG. 2 (curve A) shows that the present optimum configuration for a two-ring support structure should permit a maximum processing temperature of about 130° C. above that for a single ring support at the optimum position, about 290° C. above that for a single ring support at the wafer edge, and over 500° C. above that for a three-point support.

Wafer diameter does not affect the optimal support placement, provided that the radii of the inner and outer support structures are scaled with the wafer size. By way of example, as seen in FIG. 3, the maximum shear stress for a 200 mm silicon wafer shows strong minima when the inner and outer support structures (support rings) are located at 35.0 and 82.3 mm, respectively, from the center of the wafer. Maximum stresses increase rapidly as the support structures (here, support rings) are moved from these optimum positions. Similarly, the optimum support positions for the inner and outer support rings for a 300 mm silicon wafer are at 52.5 and 123.4 mm from the center of the wafer, respectively. These are the same relative positions of 2r/d=0.350 and 0.823 found for a 200 mm wafer. Thus, for both wafer sizes, the minimum stress on the wafer is obtained when the inner and outer ring radii are 35.0% and 82.3% of the wafer radius, respectively. This result applies to any wafer size, and so provides a general basis for specifying the optimum radial positions of two concentric support structures.

Figure 4A:
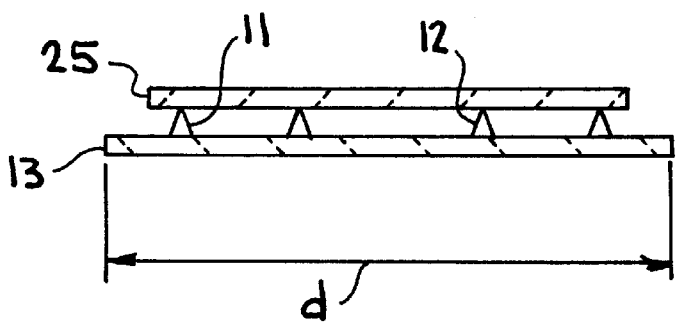
FIGS. 4(a–c) show a concentric ring embodiment of a support structure including side and top views of said support structure and a top view of said structure showing a segment in each ring removed to provide access to a wafer loading/unloading means.
Figure 4B:
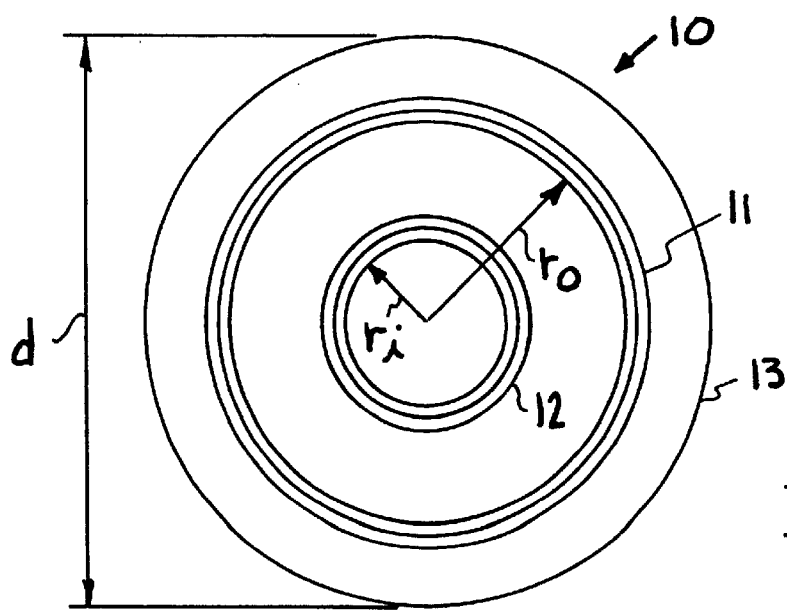
Figure 4C:
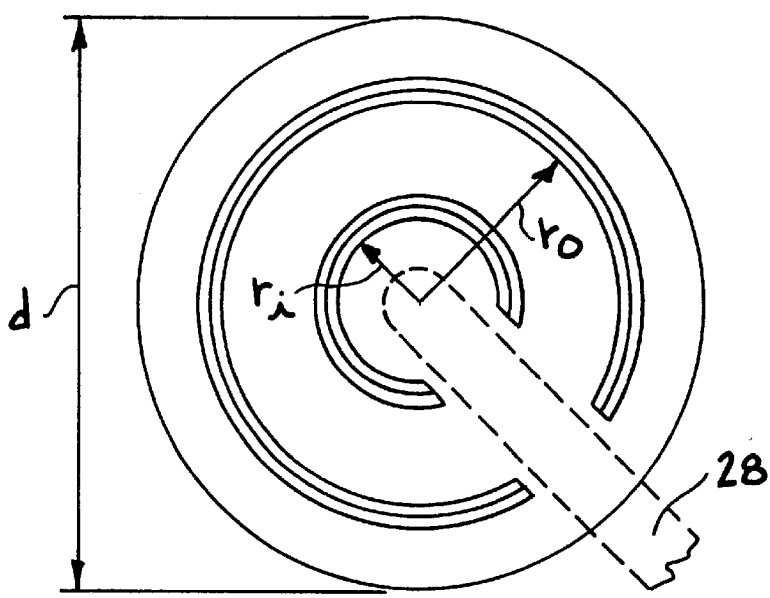
Figure 5A:
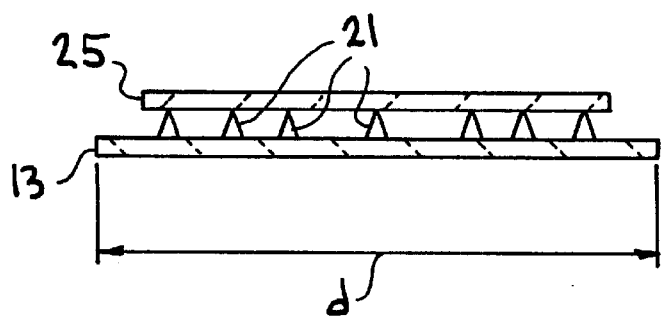
FIGS. 5(a–c) illustrate a spaced point embodiment of a support structure including side and top views of said support structure and a top view of said structure with one of said spaced points removed to provide access to a wafer loading/unloading means.
Figure 5B:
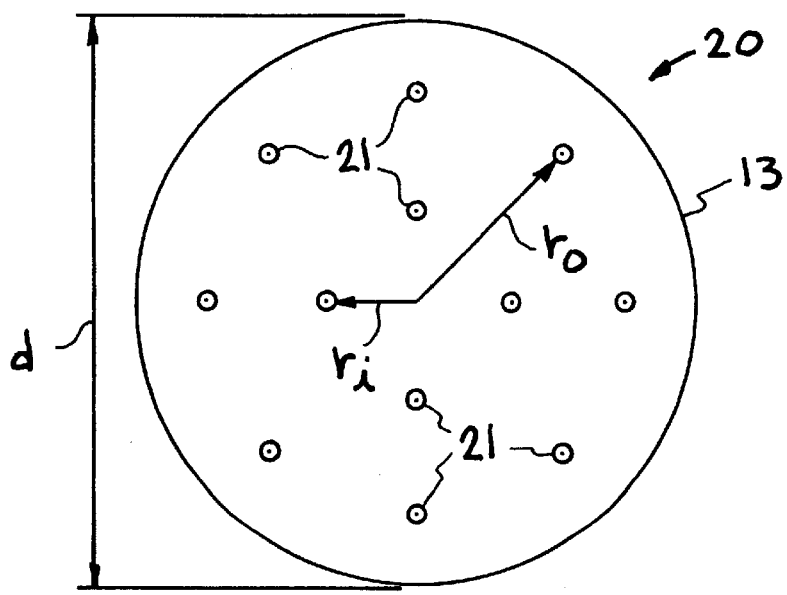
Figure 5C:
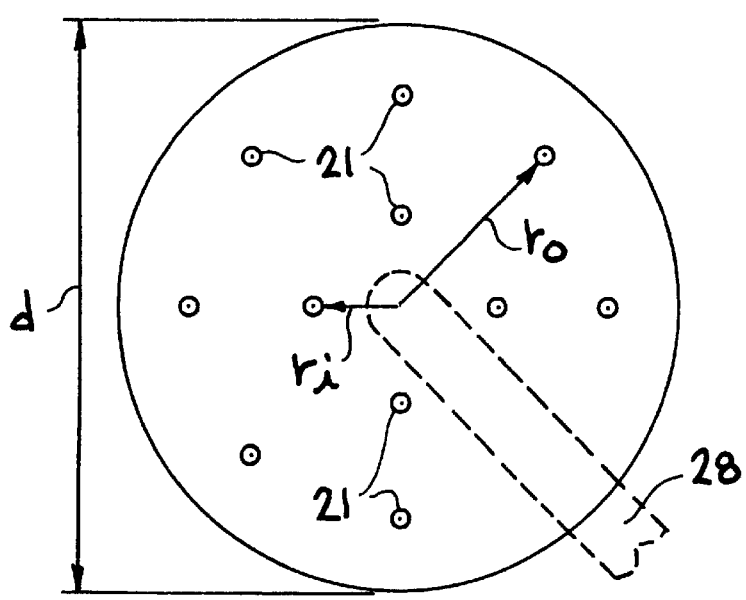

FIGS. 4 and 5 show two embodiments of the present invention. In the first embodiment, shown in FIGS. 4(a–c), the inner and outer support structures are continuous rings 11 and 12. Rings 11 and 12 can be attached to a support fixture 13, such as a common plate, to one or more common rods, or to some other structure that holds the two rings so that their top surfaces lie substantially in a horizontal plane and rigid so that the two rings remain concentric and thereby forming a support assembly 10.

Figure 6:
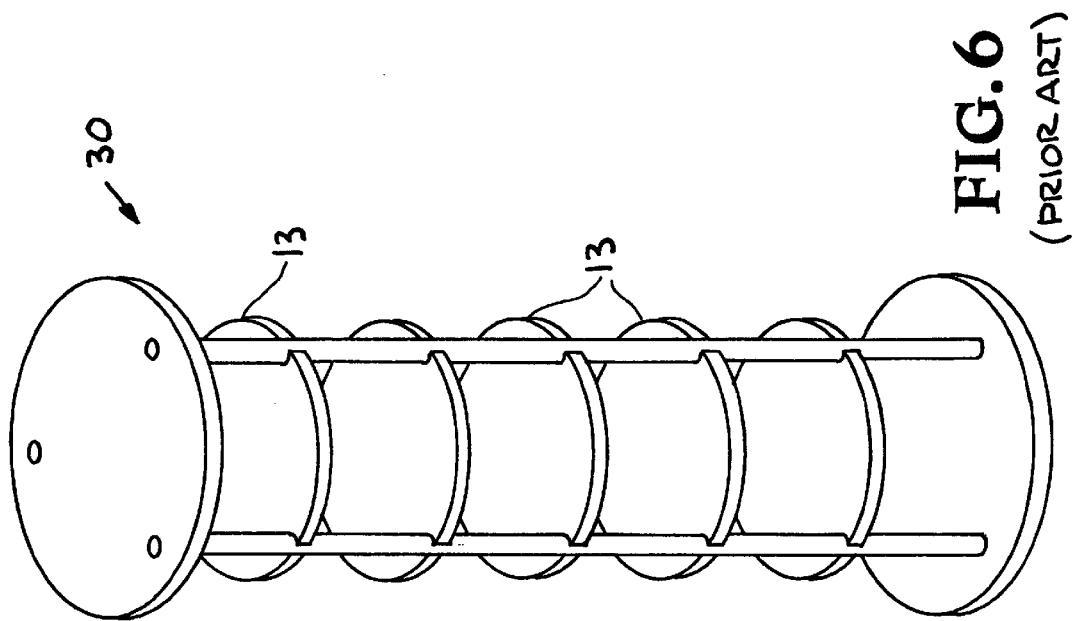
FIG. 6 shows a nor art vertical carrier assembly for thermal processing stacks of wafers.
Figures 7, 8:
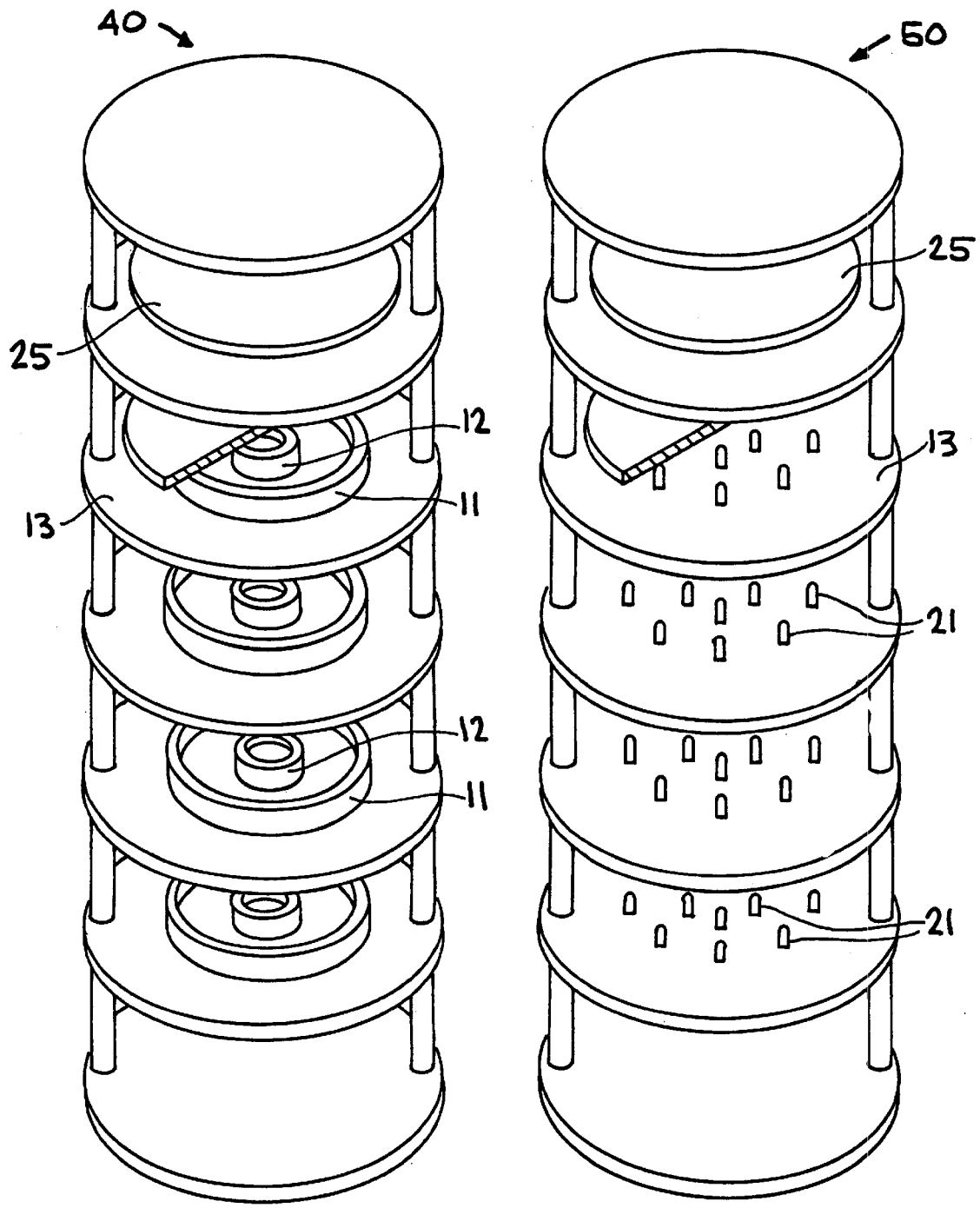
FIG. 7 shows a vertical carrier assembly which includes the concentric ring support structure embodiment.
FIG. 8 shows a vertical carrier assembly which includes the spaced point support structure embodiment.

For batch furnace applications it is known that, several such wafer support structures and their associated support fixtures can be placed one above the other in a container such as a vertical carrier means 30, as shown in FIG. 6. Similarly, in order to practice the instant invention in this mode and to permit optimum support of multiple wafers 25 in a large stack a vertical carrier means 40 includes rings 11 and 12 on each support fixture 13, as shown in FIG. 7. The rings shown in FIG. 4b are continuous and thus present an obstruction to loading of a batch furnace. However, in practice segments can be removed from either or both of the rings to provide access for wafer loading/unloading means 28, as shown in FIG. 4c.

In a second embodiment of the present support apparatus, shown in FIG. 5, the concentric support structures, such as the ring support structures 11 and 12 illustrated in FIGS. 4(b–c), can comprise discrete spaced points 21, spaced apart in a substantially uniform manner and arranged in circular and concentric patterns at either or both of the optimum radii of 2r/d=0.350 and 0.823. Similarly, support points 21, are attached to underlying support fixture 13, as in FIG. 4b, to form support assembly 20. Moreover, a few support points can be omitted to provide access for wafer loading and unloading means. If the number of support points in both the inner and outer circular patterns are sufficiently large (greater than one and preferably four for the inner support structure and greater than three and preferably eight for the outer support structure), the maximum stress produced by the second embodiment will be only slightly greater than that produced by the first embodiment. For batch furnace applications, in the case of the second embodiment, to practice the best mode and to permit optimum support of multiple wafers 25 in a large stack a vertical carrier means 50 includes support points 21 on each support fixture 13, as shown in FIG. 8, instead of rings 11 and 12.

Finally, because the present support apparatus is subjected to elevated temperatures during thermal processing it is desirable to fabricate the support apparatus, including the concentric support structures and support fixture from refractory materials, such as silicon carbide, quartz and graphite.

From the foregoing description and information, one skilled in the art can readily ascertain the essential characteristics of the present invention. The description and information presented above are intended to be illustrative of the present invention and are not to be construed as limitations or restrictions thereon, the invention being delineated in the following claims.

SEQUENCE LISTING

Not Applicable.

We claim:

1. An apparatus for supporting a surface of a semiconductor wafer during thermal processing, comprising:
   a support fixture comprising a plate-like member; and
   a wafer support means consisting of first and second arrays of uniformly spaced projecting points having substantially the same height above said plate-like member, wherein said first and second arrays of projecting points are disposed on said support fixture at respective first and second concentric diameters, wherein said first diameter is equal to about 10% to 70% of a diameter of the semiconductor wafer and said second diameter is equal to about 70% to 100% of the semiconductor wafer diameter, said support fixture and said wafer support means selected from the group of materials consisting of quartz, silicon carbide and graphite.

2. The apparatus of claim 1, wherein said first diameter is about equal to 35.0% of the semiconductor wafer diameter and wherein said second diameter is about equal to 82.3% of the semiconductor wafer diameter.

3. The apparatus of claim 1, wherein some of said uniformly spaced projecting points in said first and said second arrays of projecting points have been removed to permit access for a semiconductor wafer loading and unloading means.

4. A vertical carrier means for supporting a surface of each of a plurality of semiconductor wafers during thermal processing, comprising:
   a plurality of support fixtures extending between a top end and a bottom end of said carrier means and spaced in a substantially uniform manner between said top and bottom ends; wherein each support fixture comprises a plate-like member; and
   wafer support means disposed on each of said plurality of support fixtures, wherein each of said wafer support means consists of first and second arrays of uniformly spaced projecting points having substantially the same height above said plate-like member, wherein said first and second arrays of projecting points are disposed on said support fixture at respective first and second concentric diameters, wherein said first diameter is equal to about 10% to 70% of a diameter of the semiconductor wafer and said second diameter is equal to about 70% to 100% of the semiconductor wafer diameter, said plurality of support fixtures and said wafer support means selected from the group of materials consisting of quartz, silicon carbide and graphite.

5. The vertical carrier means of claim 4 wherein said first diameter is about equal to 35.0% of the semiconductor wafer diameter and wherein said second diameter is about equal to 82.3% of the semiconductor wafer diameter.

6. The vertical carrier of claim 4, wherein some of said uniformly spaced projecting points in said first and said second arrays of projecting points have been removed to permit access for semiconductor wafer loading and unloading means.

7. A method for supporting a semiconductor wafer during thermal processing, comprising the steps of:

providing a semiconductor wafer support means comprising:
   a support fixture comprising a plate-like member; and
   a wafer support means consisting of first and second arrays of uniformly spaced projecting points having substantially the same height above said plate-like member, wherein said first and second arrays of projecting points are disposed on said support fixture at respective first and second concentric diameters, wherein said first diameter is equal to about 10% to 70% of a diameter of the semiconductor wafer and said second diameter is equal to about 70% to 100% of the semiconductor wafer diameter; and placing said semiconductor wafer onto said wafer support means such that said semiconductor wafer is disposed about co-axially on said first and second support structures, said first and second support structures and said support fixture selected from the group consisting of quartz, silicon carbide and graphite.

* * * * *